(12) United States Patent
Reid et al.

(10) Patent No.: US 7,876,616 B2
(45) Date of Patent: Jan. 25, 2011

(54) SYSTEM AND METHOD FOR WEAR LEVELING UTILIZING A RELATIVE WEAR COUNTER

(75) Inventors: Robert Alan Reid, Superior, CO (US); Robert Pierce, Danville, CA (US); Narayanan Vinay Krishnan, San Francisco, CA (US); Amit Bhardwaj, Bangalore (IN)

(73) Assignee: Cadence Design Systems, Inc., San Jose, CA (US)

( * ) Notice: Subject to any disclaimer, the term of this patent is extended or adjusted under 35 U.S.C. 154(b) by 354 days.

(21) Appl. No.: 11/938,725

(22) Filed: Nov. 12, 2007

(65) Prior Publication Data

US 2009/0122949 A1     May 14, 2009

(51) Int. Cl.
*G11C 16/04* (2006.01)
(52) U.S. Cl. .............................. 365/185.09; 365/185.11; 365/185.29; 365/185.02
(58) Field of Classification Search ............ 365/185.02, 365/185.09, 236, 185.11, 185.33, 185.29
See application file for complete search history.

(56) References Cited

U.S. PATENT DOCUMENTS

| | | | |
|---|---|---|---|
| 7,068,553 B2* | 6/2006 | Lee ............................ | 365/200 |
| 7,480,760 B2* | 1/2009 | Bernstein et al. ............ | 711/103 |
| 2005/0073884 A1* | 4/2005 | Gonzalez et al. ....... | 365/185.02 |
| 2006/0098484 A1* | 5/2006 | Roohparvar ........... | 365/185.09 |

* cited by examiner

*Primary Examiner*—Andrew Q Tran
(74) *Attorney, Agent, or Firm*—Patent Venture Group; Joe A. Brock, II (57) ABSTRACT

An invention is provided for wear leveling in a non-volatile memory system utilizing relative wear counters to indicate relative levels of wear for each memory block in a non-volatile memory system. Whenever a memory block is erased, the associated relative wear counter is incremented. Then, when any relative wear counter reaches a predetermined limit, the value of the lowest relative wear counter is subtracted from each relative wear counter. Thus, each relative wear counter indicates a relative wear level of the associated memory block relative to other memory blocks. In this manner, the relative wear levels are maintained while reducing the amount of memory needed to for each relative wear counter.

16 Claims, 10 Drawing Sheets

SYSTEM AND METHOD FOR WEAR LEVELING UTILIZING A RELATIVE WEAR COUNTER

BACKGROUND OF THE INVENTION

1. Field of the Invention

This invention relates generally to non-volatile memory, and more particularly to providing wear leveling using a relative counter in a non-volatile memory system.

2. Description of the Related Art

In general, non-volatile memory is memory that stores data when power is disconnected from the system. Phase-change memory (PCM) and flash memory are examples of non-volatile computer memory in use today. Flash memory is a non-volatile computer memory that can be electrically erased and reprogrammed. Because flash memory retains stored data even when power to the memory is turned off, flash memory is widely used in battery-driven portable devices. For example, flash memory often is utilized in digital audio players, digital cameras, mobile phones, and USB flash drives, which are used for general storage and transfer of data between computers.

Unlike many other storage devices, flash devices cannot be overwritten. Instead, to update data in a particular storage location within flash memory, the location must first be erased, then the new data written in its place. Moreover, when erasing data in a flash device, an entire block must be erased instead of just the particular page or pages of the block that were updated. To facilitate this process, a typical flash controller will find a block of memory that has been previously erased and write the updated page to this new block at the same page offset. Then, the remaining pages of the old block are copied to the new block. Later, the old block is erased and made available for use by some other operation.

However, there are electrical limitations to the number of times a memory block can be erased before the block ceases to function properly. When this occurs, the flash memory system typically experiences a general degradation of overall performance and capacity. The actual wear within a non-volatile memory system depends on how often the individual memory blocks are erased and reprogrammed. For example, if a block is erased repeatedly, that block will wear out relatively quickly. One the other hand, if a block is programmed and the data is allowed to remain for a significant amount of time, the block will wear relatively slowly. Since many prior art non-volatile memory systems search for free blocks starting at the beginning of memory, the erase counts of blocks near the beginning of memory are typically higher than those near the end of memory, as illustrated in FIG. 1.

Figure 1:
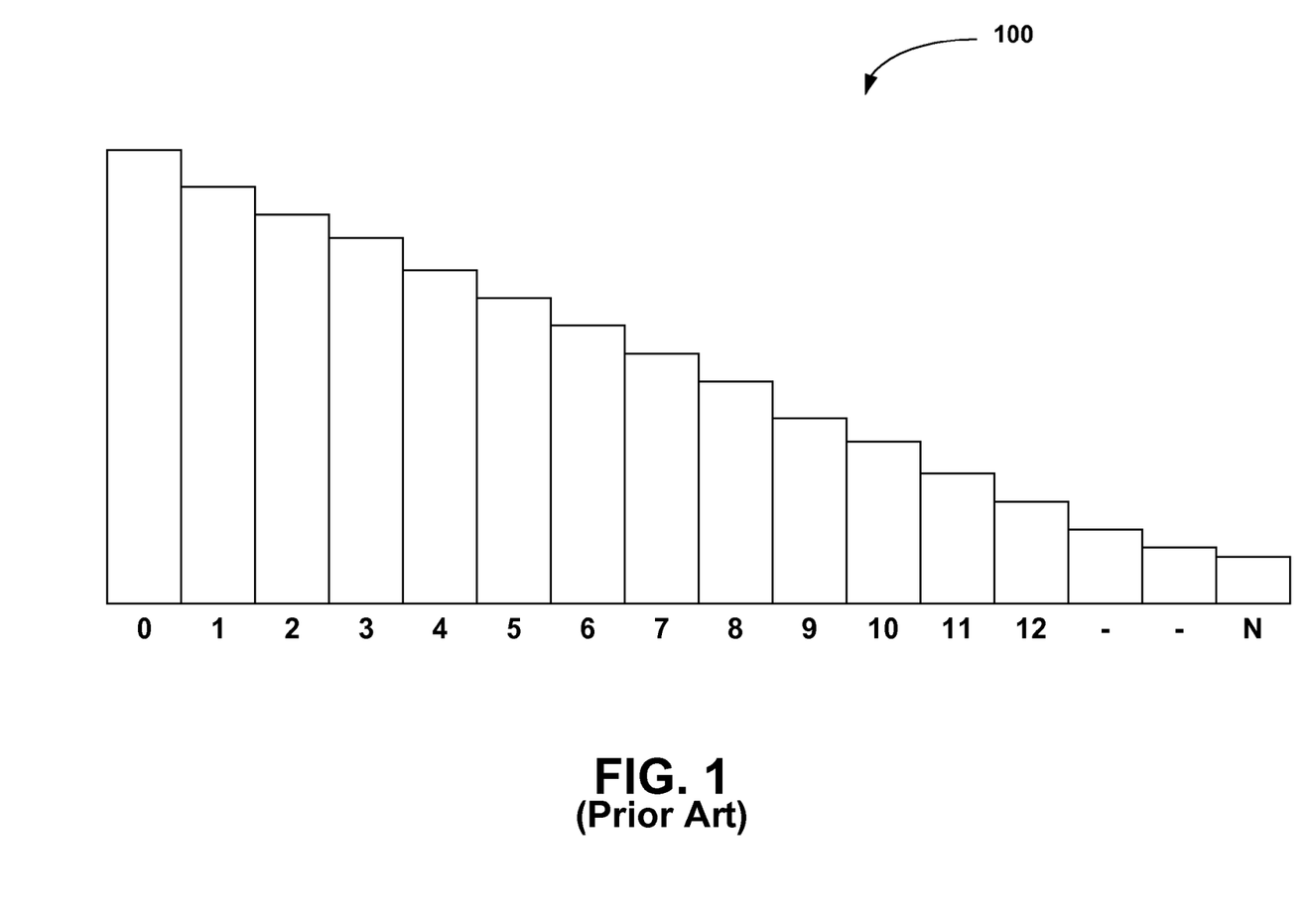
FIG. 1 is a graph showing a relative wear levels of a prior art non-volatile memory using a simple search for free blocks when writing data.

FIG. 1 is a graph 100 showing the erase counts of a prior art non-volatile memory using a simple search for free blocks when writing data. In FIG. 1, each bar represents the erase counts of each memory block. That is, each bar represents the number of erase-write cycles experienced by each memory block, with longer bars indicating a larger number of erase-write cycles. The memory starts at memory block 0 and ends at memory block N.

When writing data using a simple search for free blocks, the device typically will find the free blocks closest to the location where the search starts. In graph 100, the search starts at memory block 0. Hence, as illustrated in FIG. 1, the memory blocks closest to memory block 0 have higher erase counts than blocks closer to memory block N. When particular blocks cease to function properly because of high wear levels while other blocks are still fully operational, the non-functioning blocks can cause the flash memory system to experience a general degradation of overall performance. Hence, in the example of FIG. 1, the high wear level of memory block 0 can cause the entire memory to be compromised despite the existence of relatively unused blocks near the end of the memory. This can also occur when particular blocks of memory are programmed once and effectively never reprogrammed while other blocks are programmed and erased continuously, as illustrated next in FIG. 2.

Figure 2:
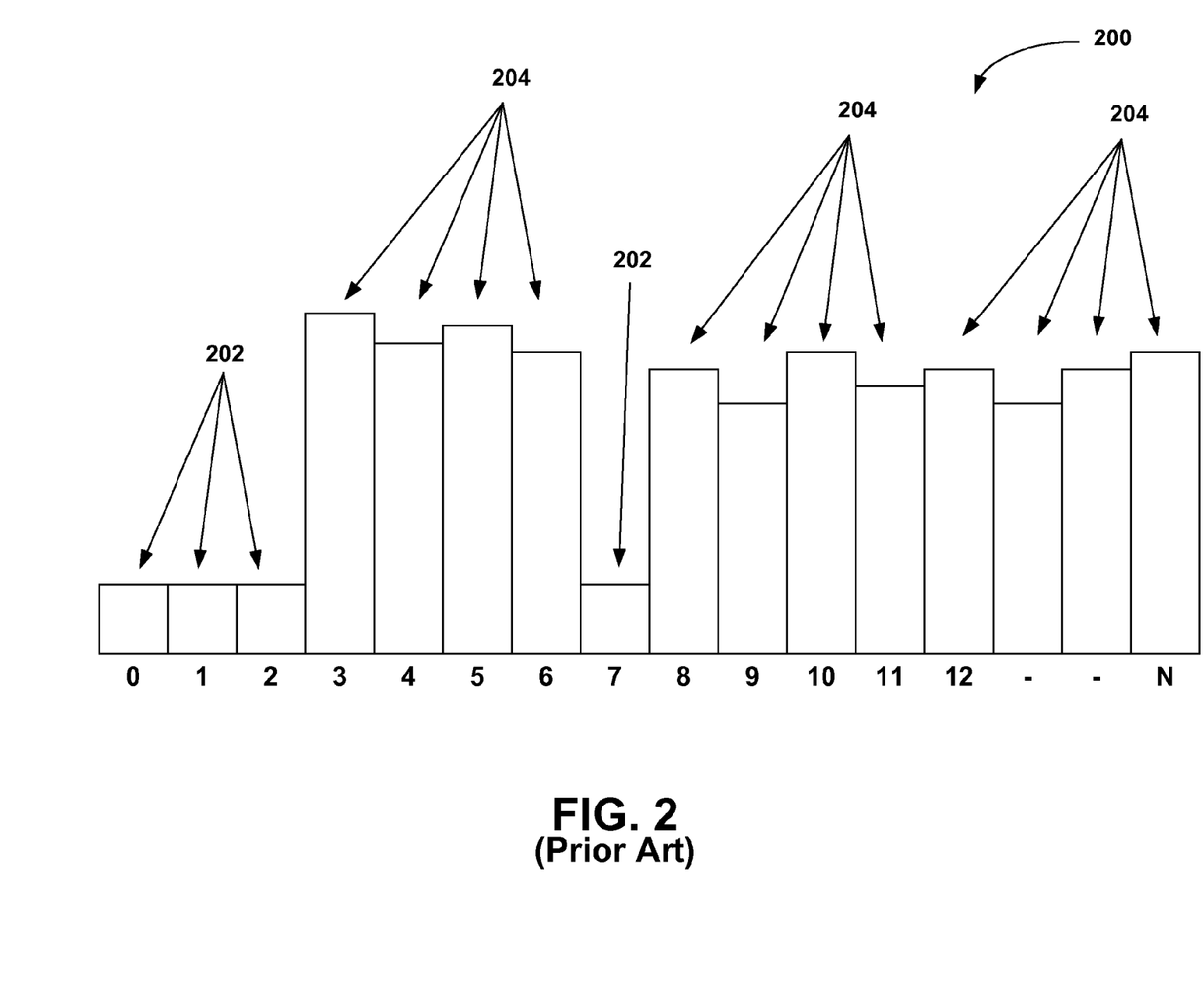
FIG. 2 is a graph showing relative wear levels of a prior art non-volatile memory having low erase-write cycle blocks and high erase-write cycle blocks.

FIG. 2 is a graph 200 showing erase counts of a prior art non-volatile memory having low erase-write cycle blocks and high erase-write cycle blocks. Similar to FIG. 1, in FIG. 2 each bar represents the relative wear level of each memory block, with longer bars indicating a larger number of erase-write cycles. The memory starts at memory 0 and ends at memory block N.

In the example of FIG. 2, several low wear level memory blocks 202 are present in the memory. These memory blocks 202 represent memory blocks that have been programmed relatively very few times. For example, they can represent blocks storing a user's favorite songs in an MP3 player. Because the user does not want to remove the songs, the memory blocks 202 storing the song data is programmed once with the song and then not reprogrammed. While the remaining memory blocks 204 are reprogrammed regularly with song data that the user only stores for a relatively short period of time. As a result, the memory blocks 202 storing the favorite songs have a low wear level, while the remaining memory blocks 204 storing transient songs have much higher wear levels. Hence, as in the example of FIG. 1, the high wear level of memory blocks 204 can cause the entire memory to be compromised despite the existence of the low wear level memory blocks 202 storing the favorite song data.

To increase the life of non-volatile memory, wear leveling procedures can be performed on the memory. Wear leveling procedures attempt to utilize the memory in an even fashion, distributing erase-write cycles evenly across the individual memory blocks of the non-volatile memory. One prior art method for wear leveling is to map addresses associated with sectors of worn memory blocks to spare areas once the blocks in which the sectors have been stored have become unusable. Unfortunately, this approach does not effectively distribute erase-write cycles evenly across the individual memory blocks. Moreover, this approach allows the non-volatile memory to degrade as the blocks are remapped.

In view of the foregoing, there is a need for systems and methods for providing effective wear leveling in a non-volatile memory system. The systems and methods should wear blocks evenly allowing increased memory usage. Moreover, the systems and methods should provide effective wear leveling without undue overhead costs and additional memory usage.

SUMMARY OF THE INVENTION

Broadly speaking, the present invention addresses these needs by providing wear leveling in a non-volatile memory system utilizing relative wear counters to indicate relative levels of wear for each memory block in a non-volatile memory system. For example, in one embodiment a method for providing wear leveling in a non-volatile memory system is disclosed. The non-volatile memory system includes a plurality of memory blocks and a plurality of relative wear counters associated with the memory blocks. Whenever a memory block is erased, the associated relative wear counter is incremented. Then, when any relative wear counter reaches a predetermined limit, the value of the lowest relative wear counter is subtracted from each relative wear counter. Each relative wear counter indicates a relative wear level of the associated memory block relative to other memory blocks. In this manner, the relative wear levels are maintained while reducing the amount of memory needed for each relative wear counter. The predetermined limit can have a value, for example, equal to the maximum value capable of being stored in a relative wear counter. However, it should be noted that any value capable of being stored in a relative wear counter can be utilized as the predetermined limit.

Using the above relative wear counters, embodiments of the present invention can perform dynamic or stating wear leveling. For example, in one aspect, a request is received to write data to non-volatile memory. In response, the plurality of relative wear counters is searched for a relative wear counter storing a lowest value, and corresponding to a free memory block. The data is then stored in the memory block associated with the relative wear counter storing the lowest value. To perform static wear leveling, an embodiment of the present invention searches the plurality of relative wear counters for a relative wear counter storing the highest value, and for a relative wear counter storing a lowest value. Data stored in the memory block associated with the relative wear counter storing the lowest value is then copied to the memory block associated with the relative wear counter storing the highest value.

A non-volatile memory system is disclosed in a further embodiment of the present invention. The non-volatile memory system includes a plurality of memory blocks, and a plurality of relative wear counters. Each relative wear counter is associated with a particular memory block. The non-volatile memory further includes logic that increments a relative wear counter associated with a memory block when the memory block is erased. Also included is logic that subtracts the value of the lowest relative wear counter from each relative wear counter when any relative wear counter reaches a predetermined limit. Each relative wear counter of the plurality of relative wear counters indicates a relative wear level of the associated memory block relative to other memory blocks. As above, logic can be included that that searches the plurality of relative wear counters for a relative wear counter storing a lowest value upon receiving a request to write data to non-volatile memory, and logic that stores the data in the memory block associated with the relative wear counter storing the lowest value.

In an additional embodiment, a data structure arranged in non-volatile memory is disclosed. The data structure includes a plurality of relative wear counters indicating relative wear levels of memory blocks, with each relative wear counter being associated with a particular memory block in non-volatile memory. The data structure is updated by incrementing a relative wear counter associated with a memory block when the memory block is erased. In addition, when any relative wear counter in the data structure reaches a predetermined limit, the value of the lowest relative wear counter is subtracted from each relative wear counter. In one embodiment, each relative wear counter is relatively small, for example one byte, or two bytes. However, it should be noted that each relative wear counter can be of any size, depending on the needs the system.

Because embodiments of the present invention are not required to store an absolute count of block erases, embodiments of the present invention can utilize small relative wear counters, such as a single byte, to store relative levels of wear for memory blocks. As can be appreciated, embodiments of the present invention can reduce the size of the plurality of relative wear counters by a factor of three or more depending on the size of the non-volatile memory. Other aspects and advantages of the invention will become apparent from the following detailed description, taken in conjunction with the accompanying drawings, illustrating by way of example the principles of the invention.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE PREFERRED EMBODIMENTS

An invention is disclosed for providing wear leveling in a non-volatile memory system utilizing relative wear counters. Broadly speaking, embodiments of the present invention utilize relative wear counters to indicate relative levels of wear for each memory block in a non-volatile memory system. A relative wear counter is a counter that stores a value indicating the relative erase count of a memory block compared to other memory blocks. For example, whenever a memory block is erased, an associated relative wear counter is incremented. When any relative wear counter reaches a predetermined limit, the value of the lowest relative wear counter is subtracted from all relative wear counters. In this manner, the relative wear levels are maintained while reducing the amount of memory needed to for each counter. Thus, by having an indication of which memory blocks have lower levels of wear, embodiments of the present invention can provide a more even distribution of erase-write cycles across the non-volatile memory blocks.

In the following description, numerous specific details are set forth in order to provide a thorough understanding of the present invention. It will be apparent, however, to one skilled in the art that the present invention may be practiced without some or all of these specific details. In other instances, well known process steps have not been described in detail in order not to unnecessarily obscure the present invention.

Figure 3:
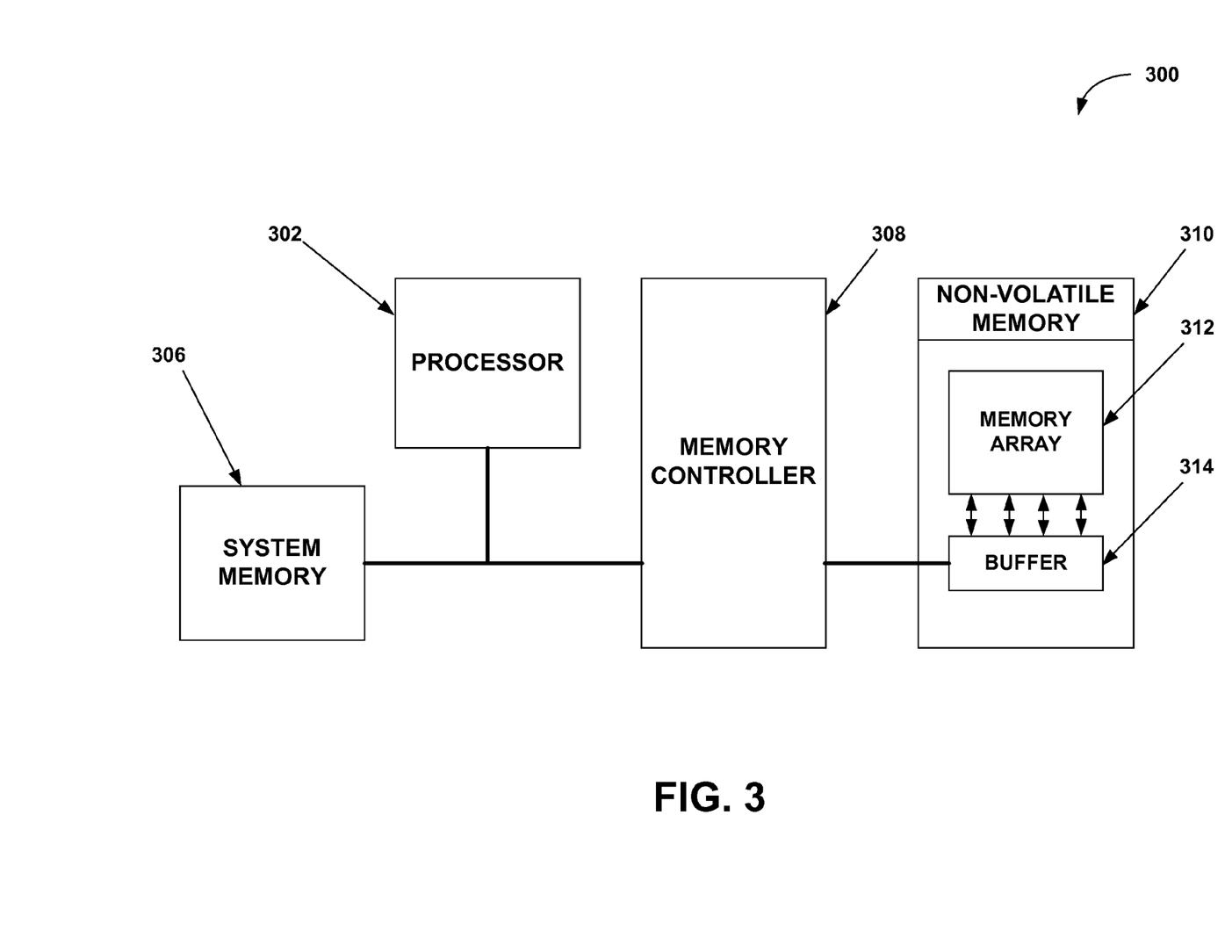
FIG. 3 is a diagram showing a system, which includes non-volatile memory with wear leveling logic utilizing relative wear counters, in accordance with an embodiment of the present invention.

FIGS. 1 and 2 were described in terms of the prior art. FIG. 3 is a diagram showing a system 300, which includes non-volatile memory with wear leveling logic utilizing relative wear counters, in accordance with an embodiment of the present invention. The system 300 includes a host processor 302 coupled to system memory 306. The host processor 302 also is coupled to a memory controller 308, which is in communication with a non-volatile memory 310. The non-volatile memory 310 includes a memory array 312 coupled to a buffer 314. The non-volatile memory 310 can be any type of non-volatile memory, such as PCM, flash memory, or any other type of non-volatile memory as will be apparent to those skilled in the art after a careful reading of the present disclosure.

During normal operation, the processor 302 utilizes the system memory 306 for many logic operations. When access to the non-volatile memory 310 is required, the processor 302 generally utilizes the memory controller 308 to read and write data to the non-volatile memory 310. To write data to the non-volatile memory 310, the processor generally instructs the memory controller 308 to transfer the data from the system memory 306 into the buffer 314 of the non-volatile memory 310. The data then is transferred from the buffer 314 and stored into the memory array 312. When the data is later read from the non-volatile memory 310, the data is transferred from the memory array 312 to the buffer 314. The memory controller 308 then reads the data from the buffer 314, and stores the data into the system memory 306 for use by the host processor 302. Typically, data is arranged in the memory array 312 in blocks, each comprised of a plurality of pages, as illustrated in FIG. 4.

Figure 4:
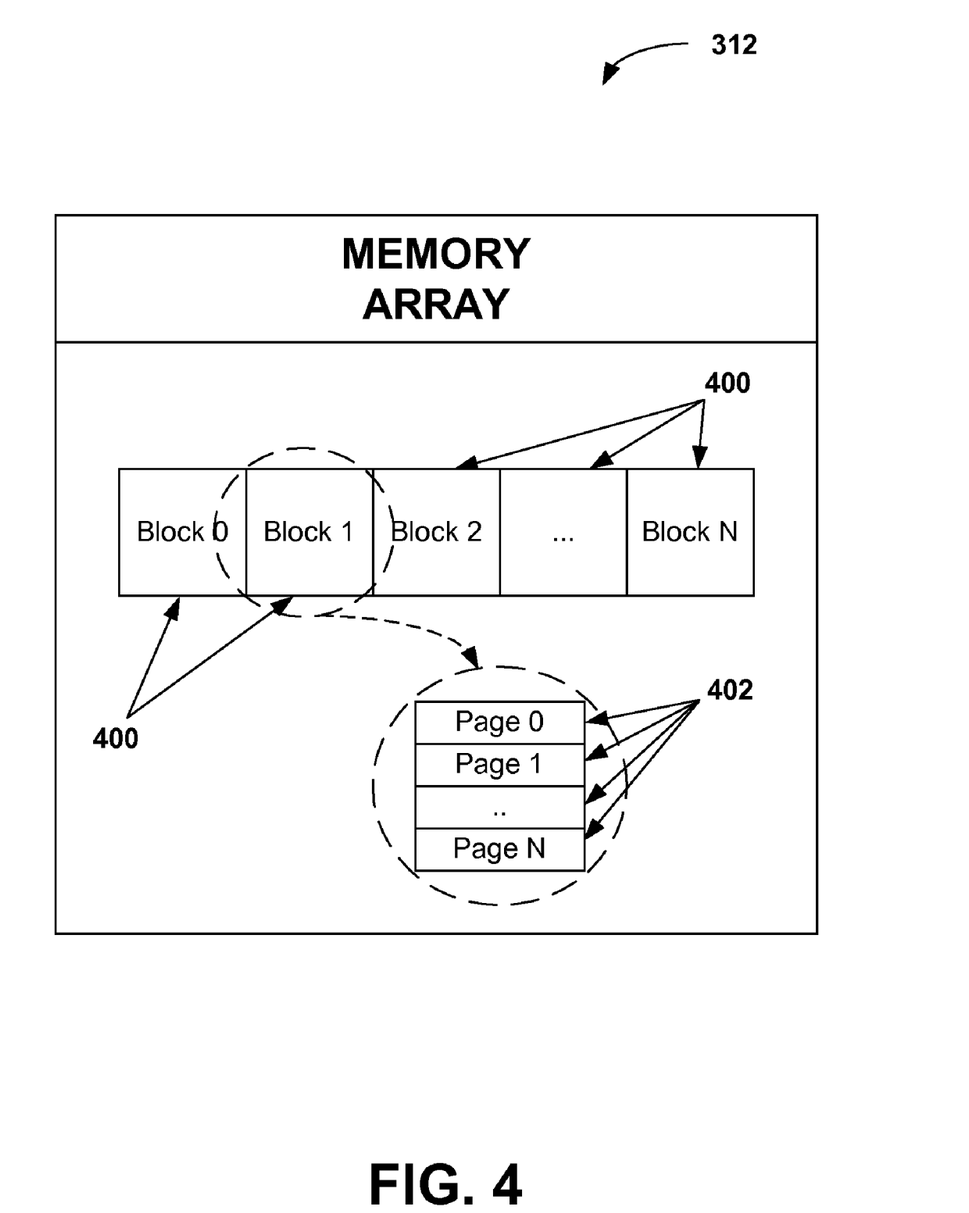
FIG. 4 is a block diagram showing an exemplary memory array, in accordance with an embodiment of the present invention.

FIG. 4 is a block diagram showing an exemplary memory array 312, in accordance with an embodiment of the present invention. As illustrated in FIG. 4, the memory array 312 generally includes a plurality of memory blocks 0-N 400, which typically is the smallest unit of memory that can be erased. Each memory block 400 is comprised of a plurality of pages 402, which generally are the smallest unit of programming. That is, when writing or reading data to and from the memory array 312, an entire page 402 of data generally is accessed at one time. When erasing data, an entire memory block 400 generally is the minimum amount of data that is erased in each operation.

As mentioned previously, there are electrical limitations to the number of times a memory block 400 can be erased before the memory block 400 ceases to function properly. When this occurs, the memory system typically experiences loss of stored data and a general degradation of overall performance. The actual wear within a non-volatile memory system depends on how often the individual memory blocks are erased and reprogrammed. For example, if a block is erased repeatedly, that block will wear out relatively quickly. One the other hand, if a block is programmed and the data is allowed to remain for a significant amount of time, the block will wear relatively slowly. Thus, uneven usage of the non-volatile memory can lead to the entire memory being compromised despite the existence of many low wear level memory blocks.

To increase the life of non-volatile memory, wear leveling procedures can be performed on the memory. Wear leveling procedures attempt to utilize the memory in an even fashion, distributing erase-write cycles evenly across the individual memory blocks of the non-volatile memory. To provide wear leveling in the non-volatile memory system, embodiments of the present invention utilize relative wear counters to indicate relative levels of wear for each memory block 400 in the memory array 312.

Figure 5:
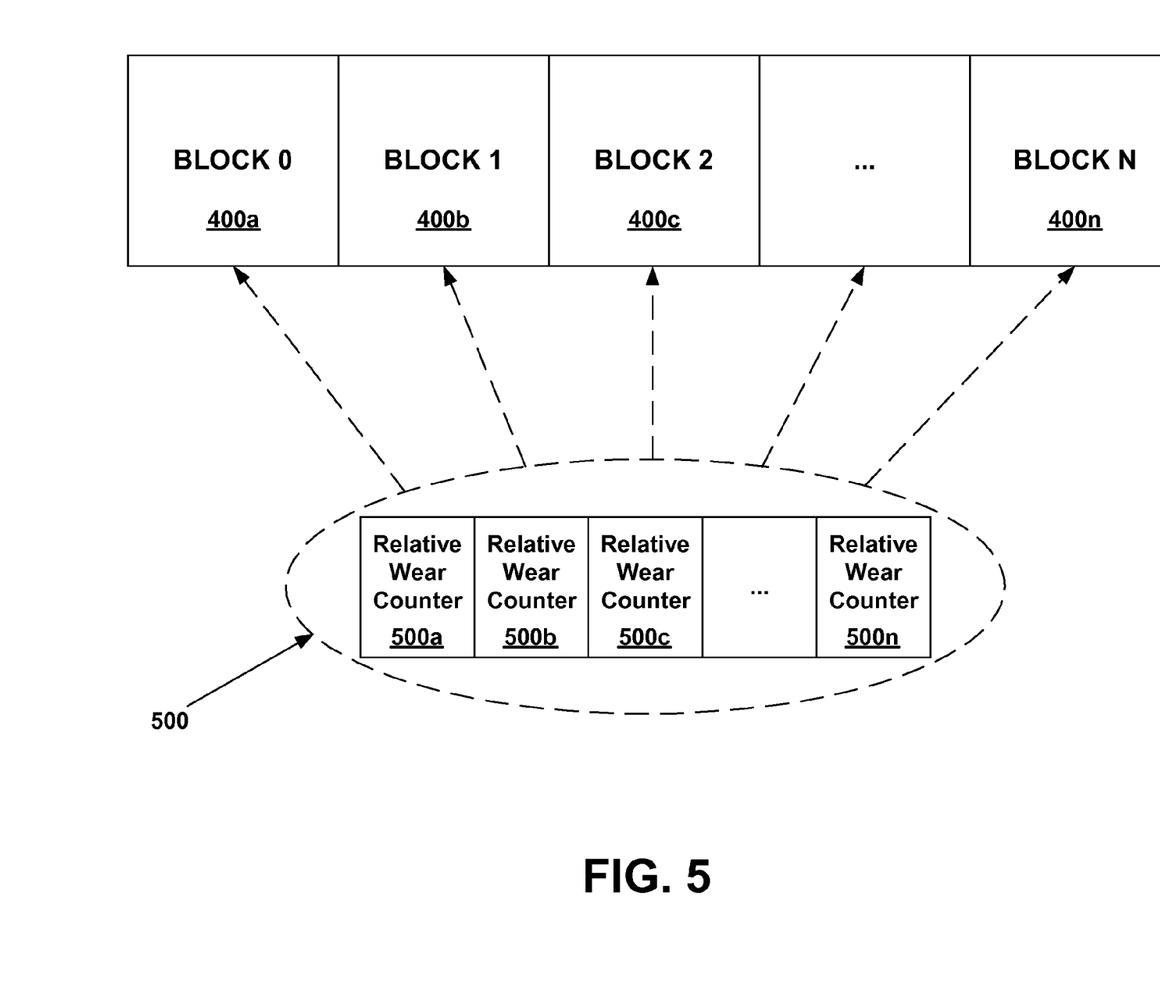
FIG. 5 is a block diagram showing the relation between memory blocks and relative wear counters, in accordance with an embodiment of the present invention.

FIG. 5 is a block diagram showing the relation between memory blocks 400 and relative wear counters 500, in accordance with an embodiment of the present invention. As mentioned previously, embodiments of the present invention can provide a more even distribution of erase-write cycles across the memory blocks 400 by having an indication of which memory blocks have lower levels of wear. To this end, embodiments of the present invention associate a relative wear counter 500 with each memory block 400 in the memory array. For example, in FIG. 5, relative wear counter 500a is associated with memory block 0 400a, relative wear counter 500b is associated with memory block 1 400b, relative wear counter 500c is associated with memory block 2 400c, and so on to relative wear counter 500n is associated with memory block N 400n.

A relative wear counter is a counter that stores a value indicating the relative erase count of a memory block compared to other memory blocks. For example, in FIG. 5, each relative wear counter 500a-500n provides an indication of the relative wear level of the associated memory block 400a-400n relative to other memory blocks. Using the relative wear counters 500a-500n, embodiments of the present invention can determine which memory block 400a-400n have been erased the most number times, and which memory block 400a-400n has been erased the least number of times. In this manner, embodiments of the present invention can perform wear leveling operations to extend the life of non-volatile memory systems by more evenly distributing memory block usage, as will be described in greater detail subsequently.

To provide an indication of the relative wear level of the memory blocks 400a-400n, the associated relative wear counter 500a-500n is incremented each time the associate memory block 400a-400n is erased. For example, each time memory block 1 400b is erased, the associated relative wear counter 500b is incremented. Thus, by examining the relative wear counters 500a-500n, embodiments of the present invention can determine which memory block 400a-400n has been erased the most number times, and which memory block 400a-400n has been erased the least number of times. That is, the memory block 400a-400n associated with the relative wear counter 500a-500n having the highest value is the memory block that has been erased the most number of times. Similarly, the memory block 400a-400n associated with the relative wear counter 500a-500n having the lowest value is the memory block that has been erased the least number of times.

Although variances occur depending on the specific memory, typical non-volatile memory blocks often can withstand over 100,000 write-erase cycles before becoming unusable. Thus, to keep an absolute count of the number of times a memory block has been erased would require a counter capable of storing a value of at least 100,000. Storing a value of 100,000 requires a counter of at least three bytes. Thus, the amount of memory required to store a table of absolute erase counters requires a large amount of memory as the number of memory blocks increases. To address this issue, embodiments of the present invention utilize relative wear counters that reflect the relative wear level of the associate memory blocks rather than the absolute erase count of each memory block. This is accomplished by subtracting the value of lowest relative wear counter from all the relative wear counters when any relative wear counter reaches a predetermined limit, as discussed next with reference to FIG. 6.

Figure 6:
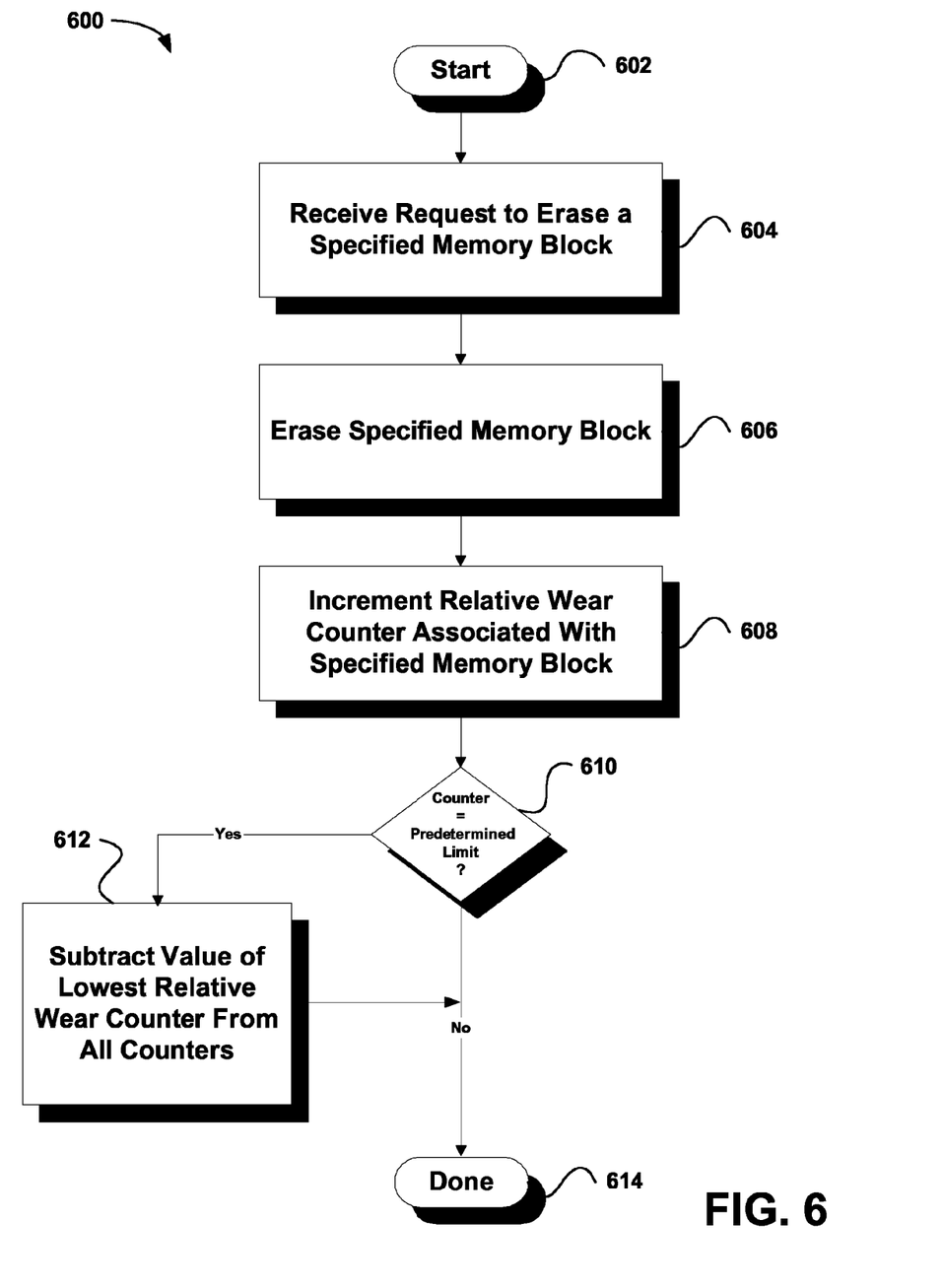
FIG. 6 is a flowchart showing a method for providing wear leveling in a non-volatile memory system using relative wear counters, in accordance with an embodiment of the present invention.

FIG. 6 is a flowchart showing a method 600 for providing wear leveling in a non-volatile memory system using relative wear counters, in accordance with an embodiment of the present invention. In an initial operation 602, preprocess operations are performed. Preprocess operations can include, for example, performing read/write operations, updating address tables, and other preprocess operations that will be apparent to those skilled in the art after a careful reading of the present disclosure.

In operation 604, a request to erase a specified memory block is received. The request may include erasing a single memory block or a plurality of memory blocks depending on the needs of the system. Although reads and writes can be performed on a single page of data, typical non-volatile memory often has a minimum memory size that must be erased in a single operation. Generally, this minimum amount is one memory block.

Once the request is received, the specific memory block is erased, in operation 606. For example, referring back to FIG. 5, a request may be received to erase memory block 2 400c. In this case, the memory controller instructs the non-volatile memory device to erase the data corresponding to the pages of memory block 2 400c. As mentioned above, the actual wear within a non-volatile memory system depends on how the individual memory blocks are erased and reprogrammed. To increase the life of non-volatile memory, wear leveling procedures that attempt utilize the memory in an even manner are performed on the memory. The embodiments of the present invention provide wear leveling utilizing relative wear counters to indicate relative levels of wear for each memory block in the memory array, as described in operation 608.

Referring back to FIG. 6, wear leveling logic increments the relative wear counter associated with the specified memory block, in operation 608. Continuing with the example of FIG. 5, the corresponding relative wear counter for memory block 2 400c is relative wear counter 500c. Thus, in this example, relative wear counter 500c is incremented when memory block 2 400c is erased, as shown in FIG. 7A.

Figure 7A:
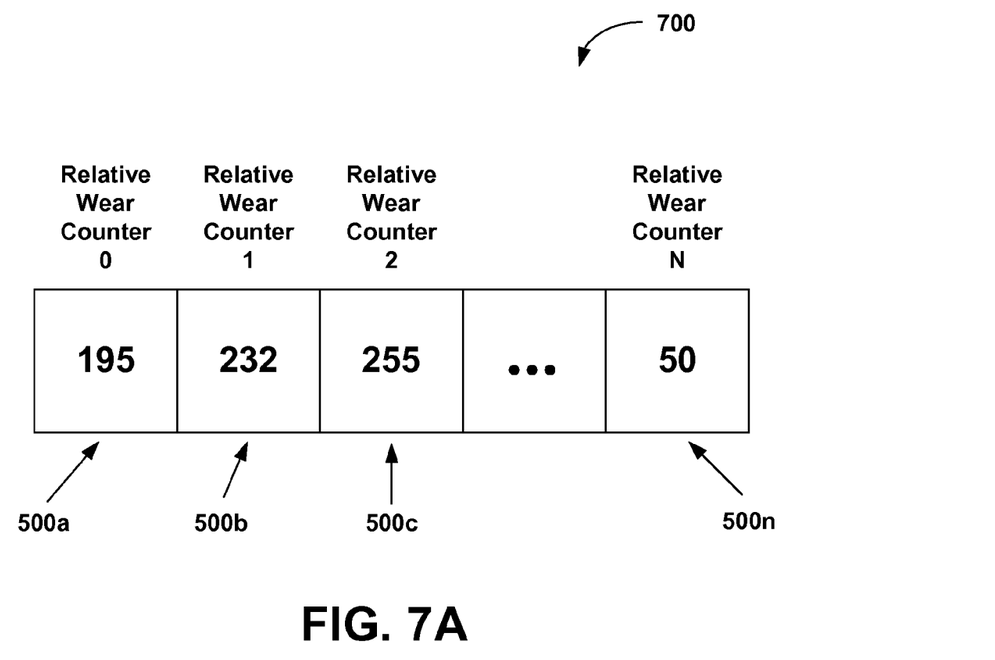
FIG. 7A is a diagram showing an exemplary table of relative wear counters, in accordance with an embodiment of the present invention.

FIG. 7A is a diagram showing an exemplary table 700 of relative wear counters, in accordance with an embodiment of the present invention. The exemplary table 700 includes a plurality of relative wear counters 500a-500n. As mentioned above, when a memory block is erased, the corresponding relative wear counter 500a-500n is incremented. For example, when memory block 2 400c of FIG. 5 is erased, the corresponding relative wear counter 500c of FIG. 7A is incremented.

In addition, FIG. 7A shows exemplary values of relative wear counters after relative wear counter 500c is incremented. For example, relative wear counter 500a has an exemplary value of 195, relative wear counter 500b has an exemplary value of 232, relative wear counter 500c has an exemplary value of 255, and relative wear counter 500n has an exemplary value of 50.

Referring back to FIG. 6, a decision is made as to whether the relative wear counter just incremented is equal to a predetermined limit, in operation 610. In one embodiment, the predetermined limit is the maximum value that one relative wear counter can store. For example, when the relative wear counter is one byte, the predetermined limit can be a value of 255. However, it should be noted that any value that can be represented in a single relative wear counter can be utilized as a predetermined limit. Also, although embodiments of the present invention will be described in terms of testing for equality with the predetermined limit, subtraction can alternatively be triggered when a relative wear counter is greater than the predetermined limit. If the relative wear counter just incremented is equal to a predetermined limit, the method 600 branches to operation 612. Otherwise the method 600 ends with operation 614.

In operation 612, the value of the lowest relative wear counter is subtracted from all relative wear counters. As mentioned above, when a memory block is erased, the corresponding relative wear counter 500a-500n is incremented. In the example of FIG. 7A, the predetermined limit is the value 255. However, as mentioned previously, it should be noted that the predetermined limit can be any value capable of being represented by a single relative wear counter.

Continuing with the example of FIG. 7A, relative wear counter 500c has reached the predetermined limit of 255. Thus, the wear leveling logic of the embodiments of the present invention searches the table 700 of relative wear counters 500a-500n to determine the value of lowest relative wear counter. In this example, the lowest value is 50, which is stored in relative wear counter 500n. The wear leveling logic then subtracts 50 from each relative wear counter 500a-500n, as illustrated next with reference to FIG. 7B.

Figure 7B:
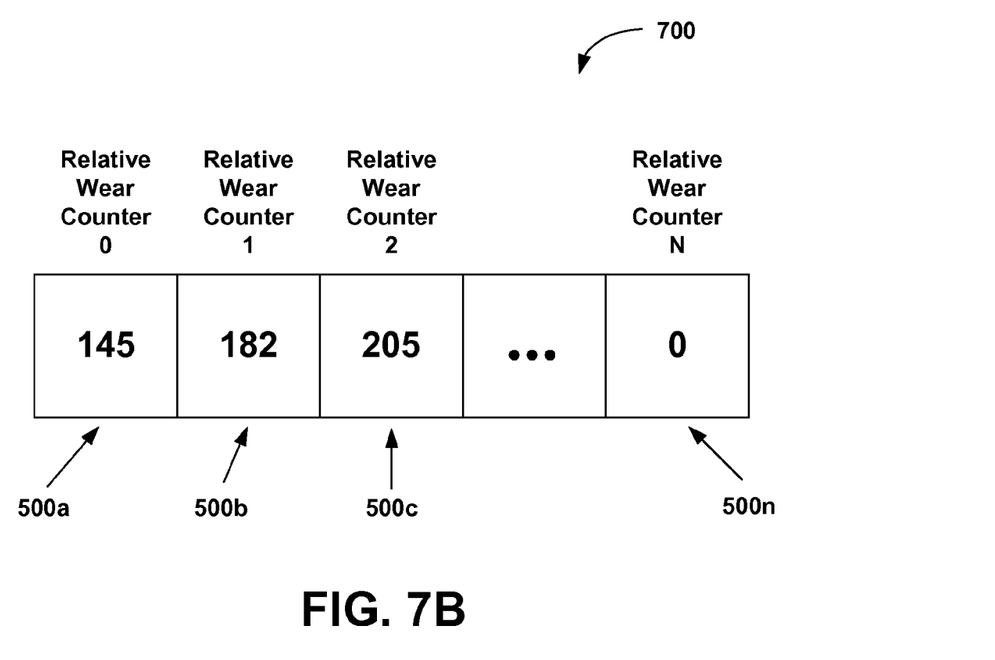
FIG. 7B is a diagram showing the table of relative wear counters after subtracting the value of the lowest relative wear counter from all relative wear counters, in accordance with an embodiment of the present invention.

FIG. 7B is a diagram showing the table 700 of relative wear counters after subtracting the value of the lowest relative wear counter from all relative wear counters, in accordance with an embodiment of the present invention. For example, relative wear counter 500a previously stored a value of 195 in the example of FIG. 7A. The value of 50 is subtracted from the previously stored a value of 195 leaving a value of 145 stored in relative wear counter 500a. Similarly, relative wear counter 500b previously stored a value of 232 in the example of FIG. 7A. The value of 50 is subtracted from the previously stored a value of 232 leaving a value of 182 stored in relative wear counter 500b. Subtracting the value of 50 from the previously stored values of 255 and 50 in relative wear counters 500c and 500n leaves values of 205 and 0 stored in relative wear counters 500c and 500n respectively.

Turning back to FIG. 6, post process operations are performed in operation 614. Post process operations can include, for example, performing dynamic wear leveling functions, performing static wear leveling functions, and other post process operations that will be apparent to those skilled in the art after a careful reading of the present disclosure. In this manner, embodiments of the present invention can determine wear levels of memory blocks relative to each other. Also, by subtracting the value of the lowest relative wear counter from all relative wear counters when the predetermined limit is reached by a counter, embodiments of the present invention are able to utilize smaller counters to indicate relative wearing levels. As mentioned previously, typical non-volatile memory blocks often can withstand over 100,000 write-erase cycles before becoming unusable. Thus, to keep an absolute count of the number of times a memory block has been erased would require a counter capable of storing a value of at least 100,000, which requires a counter of at least three bytes. Because embodiments of the present invention are not required to store an absolute count of block erases, embodiment of the present invention can utilize relative wear counters that are only a single byte to store relative levels of wear for memory blocks. As can be appreciated, in this example embodiments of the present invention can reduce the size of the table of counters by a factor of three. Using the table of relative wear counters, embodiments of the present invention can perform wear leveling either dynamically or statically.

Figure 8:
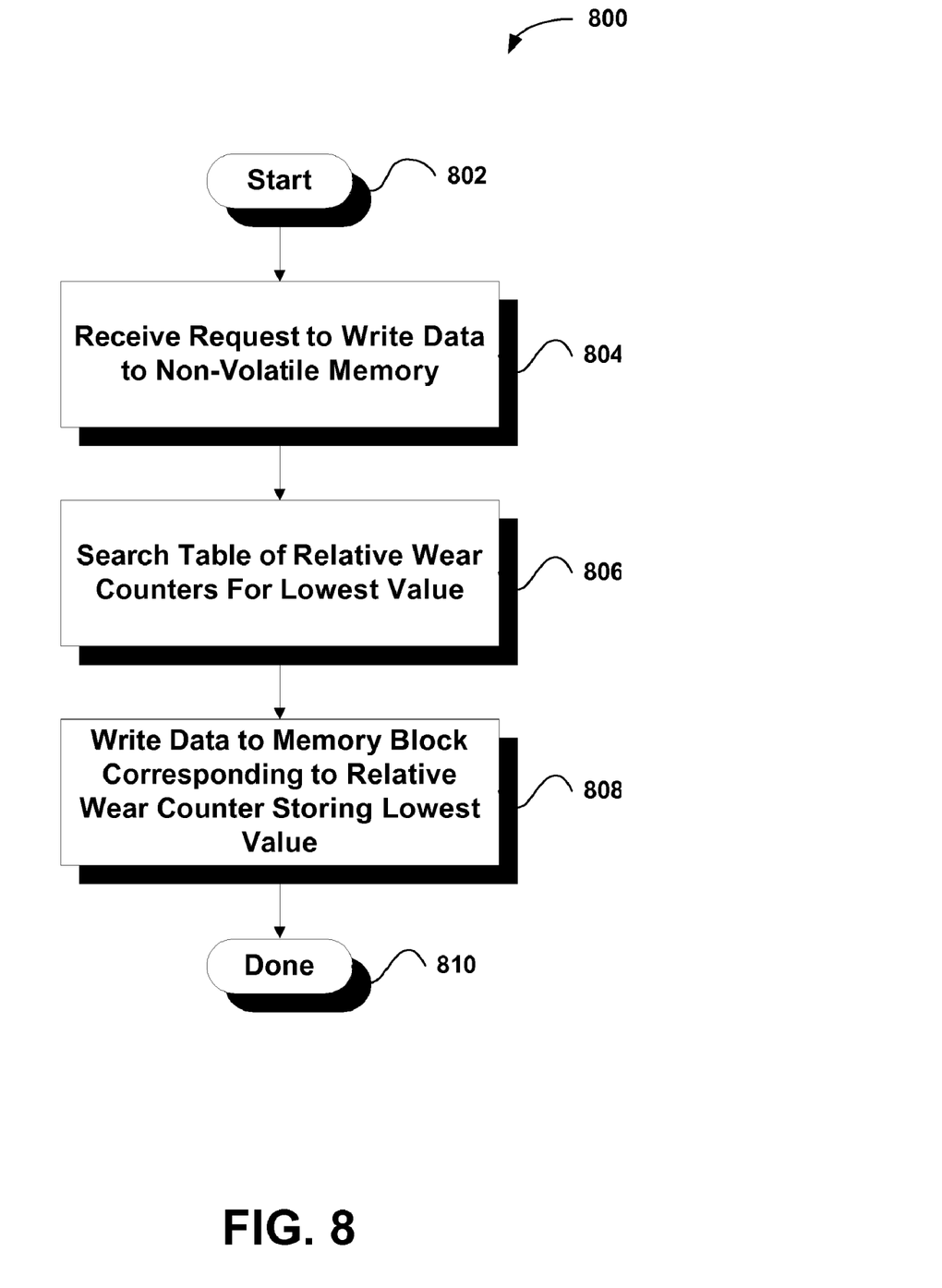
FIG. 8 is a flowchart showing a method for performing dynamic wear leveling using relative wear counters, in accordance with an embodiment of the present invention.

FIG. 8 is a flowchart showing a method 800 for performing dynamic wear leveling using relative wear counters, in accordance with an embodiment of the present invention. In an initial operation 802, preprocess operations are performed. Preprocess operations can include, for example, receiving requests to erase memory blocks, updating relative wear counters, and other preprocess operations that will be apparent to those skilled in the art after a careful reading of the present disclosure.

In operation 804, a request to write data to non-volatile memory is received. The request may include writing to a single page or a plurality of pages depending on the needs of the system. Although erase operations typically require an entire memory block to be erased, read and write operations generally can be performed on a single page of data.

Once the request is received, the table of relative wear counters is searched for the lowest stored value, in operation 806. As mentioned above with respect to FIG. 6, each time a memory block is erased, embodiments of the present invention increment the associated relative wear counter. Thus, the relative wear counters provide an indication of the wear levels for the various memory blocks of the non-volatile memory. That is, using the relative wear counters, embodiments of the present invention can determine which memory block have been erased the most number times, and which memory block has been erased the least number of times. Thus, embodiments of the present invention determine which memory block has the lowest level of wear by determining which relative wear counter has the lowest value.

In operation 808, the data is written to the memory block corresponding to the relative wear counter having the lowest value. The memory block corresponding the relative wear counter having the lowest value is the memory block having the least number of erase operations performed on it, and thus the lowest level of wear. Hence, in operation 808, embodiments of the present invention write the data in the memory bock having the lowest level of wear.

Post process operations are performed in operation 810. Post process operations can include, for example, receiving further erase requests, receiving further read/write requests, performing static wear leveling, and other post process operations that will be apparent to those skilled in the art after a careful reading of the present disclosure. In this manner, embodiments of the present invention perform wear leveling during normal operation when writing data to non-volatile memory, as illustrated next with reference to FIG. 9.

Figure 9:
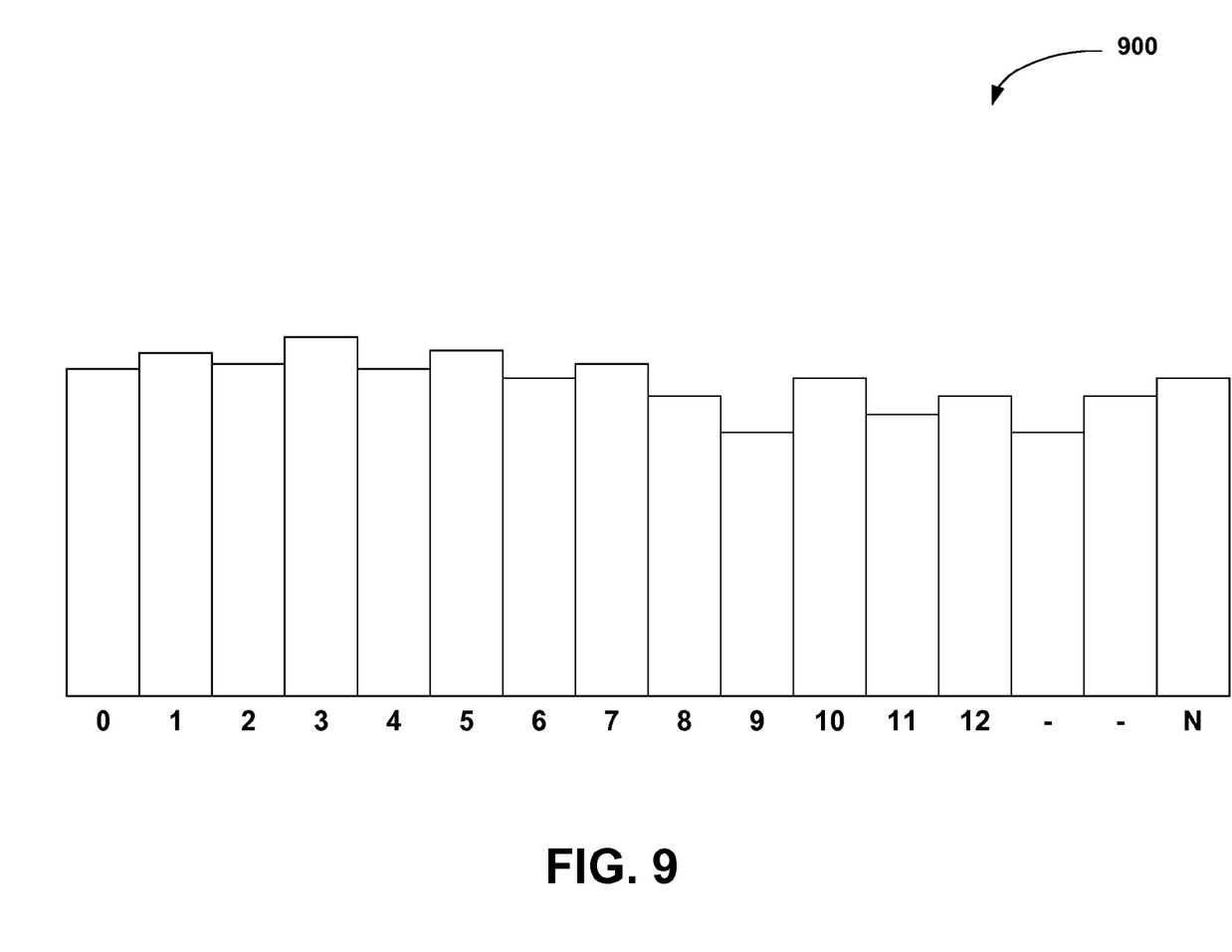
FIG. 9 is a graph showing relative wear levels of a non-volatile memory using dynamic wear leveling, in accordance with an embodiment of then present invention.

FIG. 9 is a graph 900 showing relative wear levels of a non-volatile memory using dynamic wear leveling, in accordance with an embodiment of then present invention. In FIG. 9 each bar represents the relative wear level of a memory block, with longer bars indicating a larger number of erase-write cycles. The memory starts at memory 0 and ends at memory block N. As can be seen, when writing data to non-volatile memory utilizing dynamic wear leveling as discussed with respect to FIG. 8, embodiments of the present invention utilize the memory in an even fashion, distributing erase-write cycles more evenly across the individual memory blocks of the non-volatile memory. In addition to performing wear leveling dynamically during write operations, embodiments of the present invention can perform static wear leveling, as described next with reference to FIG. 10.

Figure 10:
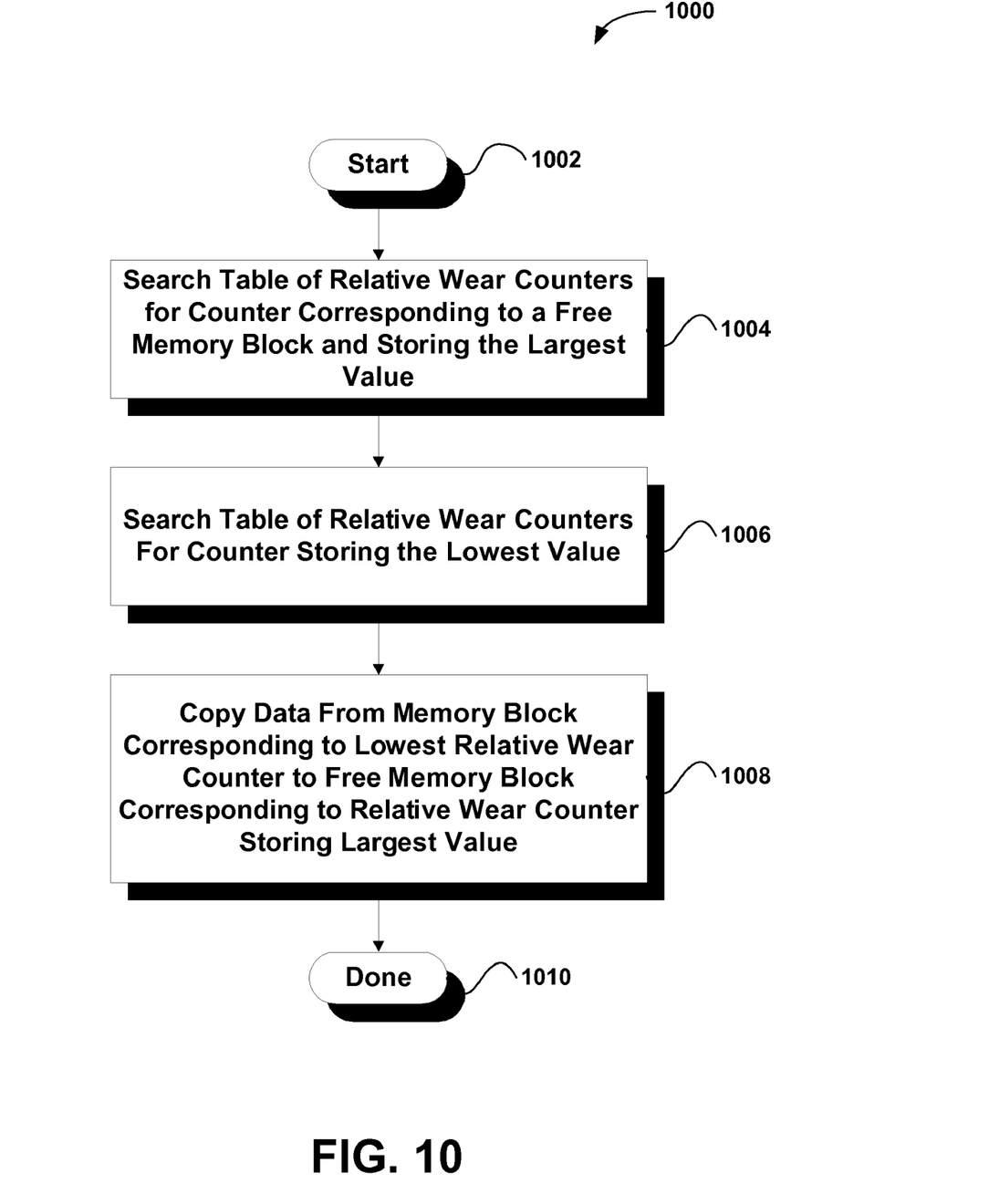
FIG. 10 is a flowchart showing a method for static wear leveling utilizing relative wear counters, in accordance with an embodiment of the present invention.

FIG. 10 is a flowchart showing a method 1000 for static wear leveling utilizing relative wear counters, in accordance with an embodiment of the present invention. In an initial operation 1002, preprocess operations are performed. Preprocess operations can include, for example, performing dynamic wear leveling, receiving a static wear leveling request, and other preprocess operations that will be apparent to those skilled in the art after a careful reading of the present disclosure.

In operation 1004, the table of relative wear counters is searched for the relative wear counter corresponding to both a free memory block and storing the largest value. One purpose of static wear leveling is to reduce the usage of memory blocks having a high level of wear. To do this, embodiments of the present invention identify a free memory block having a high level of wear. The relative wear counter storing the largest value, and corresponding to a free memory block, corresponds to the free memory block having the highest level of wear. Once found, the memory block will be utilized to store data that is predicted to be maintained in memory, without being erased frequently, as described next.

In operation 1006, the table of relative wear counters is searched for the relative wear counter corresponding to a memory block currently in use and storing the lowest value. Static data is data that is to remain stored in non-volatile memory for a relatively prolonged period of time. An example of such data is system data utilized for system operation. Such data stored in non-volatile memory generally is not erased once written to memory. Another example of generally static data can be favorite MP3 data or favorite image files. For example, when a user stores MP3 data for a favorite song, or a favorite image file, the user generally allows the data to remain in non-volatile memory. When such data is stored in non-volatile memory, the memory block or blocks storing such data generally have a low level of wear because the data is stored and allowed to remain in non-volatile memory without being erased.

Thus, to predict which memory blocks store static data, embodiments of the present invention search for memory blocks having low levels of wear. The relative wear counter corresponding to a memory block currently in use and storing the lowest value corresponds to a memory block having the lowest level of wear and thus is predicted as capable of storing static data.

Once the two memory blocks are found, the data from the memory block corresponding to the relative wear counter storing the lowest value is copied to the free memory block corresponding the relative wear counter storing the highest value, in operation 1008. As mentioned above, the data found in operation 1006 is likely to remain relatively static, and thus unlikely to be erased frequently. Thus, embodiments of the present invention copy this data to the high wear level free memory block found in operation 1004 to slow the wearing of the memory block.

Post process operations are performed in operation 1010. Post process operations can include, for example, updating an address table to indicate the new location of the moved data, updating free memory usage data, and other post process operations that will be apparent to those skilled in the art after a careful reading of the present disclosure. In this manner, embodiments of the present invention attempt to predict where static data is stored, and move that data to high wear level memory locations. Once static data is stored in a high wear level memory location, the wear in that location should slow because the static data is unlikely to be erased or at least erased less frequently. In one embodiment, static wear leveling operations are performed in response to receiving a command to perform static wear leveling. In this manner, static wear leveling can occur during lowest use periods or when the non-volatile memory is otherwise idle.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for providing wear leveling in a non-volatile memory system, the non-volatile memory system including a plurality of memory blocks and a plurality of relative wear counters associated with the memory blocks, comprising the operations of:
    incrementing a relative wear counter associated with a memory block when the memory block is erased; and
    subtracting a value of a lowest relative wear counter from each relative wear counter when any relative wear counter reaches a predetermined limit.

2. A method as recited in claim 1, wherein each relative wear counter indicates a relative wear level of the associated memory block relative to other memory blocks.

3. A method as recited in claim 1, wherein the predetermined limit is a value equal to the maximum value capable of being stored in a relative wear counter.

4. A method as recited in claim 1, further comprising the operations of:
    receiving a request to write data to the non-volatile memory;
    searching the plurality of relative wear counters for a relative wear counter storing a lowest value; and
    storing the data in the memory block associated with the relative wear counter storing the lowest value.

5. A method as recited in claim 4, wherein the memory block having the lowest value is a free memory block.

6. A method as recited in claim 1, further comprising the operations of:
    searching the plurality of relative wear counters for a relative wear counter storing a highest value;
    searching the plurality of relative wear counters for a relative wear counter storing a lowest value; and
    moving data stored in the memory block associated with the relative wear counter storing the lowest value to the memory block associated with the relative wear counter storing the highest value.

7. A method as recited in claim 6, wherein the relative wear counter having the highest value is associated with a free memory block.

8. A non-volatile memory system, comprising:
    a plurality of memory blocks;
    a plurality of relative wear counters, each relative wear counter being associated with a particular memory block;
    logic that increments a relative wear counter associated with a memory block when the memory block is erased; and
    logic that subtracts a value of a lowest relative wear counter from each relative wear counter when any relative wear counter reaches a predetermined limit.

9. A non-volatile memory system as recited in claim 8, wherein each relative wear counter of the plurality of relative wear counters indicates a relative wear level of the associated memory block relative to other memory blocks.

10. A non-volatile memory system as recited in claim 8, wherein the predetermined limit is a value equal to the maximum value capable of being stored in a relative wear counter.

11. A non-volatile memory system as recited in claim 8, further comprising:
    logic that searches the plurality of relative wear counters for a relative wear counter storing a lowest value upon receiving a request to write data to the non-volatile memory; and
    logic that stores the data in the memory block associated with the relative wear counter storing the lowest value.

12. A non-volatile memory system as recited in claim 11, the relative wear counter storing the lowest value is associated with a free memory block.

13. A non-volatile memory system as recited in claim 8, further comprising:
    logic that searches the plurality of relative wear counters for a relative wear counter storing a highest value;
    logic that searches the plurality of relative wear counters for a relative wear counter storing a lowest value; and
    logic that moves data stored in the memory block associated with the relative wear counter storing the lowest value to the memory block associated with the relative wear counter storing the highest value.

14. A non-volatile memory system as recited in claim 13, further comprising the operation of receiving a request to perform static wear leveling.

15. A non-volatile memory system as recited in claim 13, wherein the relative wear counter storing the highest value is associated with a free memory block.

16. A non-volatile memory system as recited in claim 8, further comprising:
    logic that searches the plurality of relative wear counters for a relative wear counter storing a relatively high value;
    logic that searches the plurality of relative wear counters for a relative wear counter storing a relatively low value; and
    logic that moves data stored in the memory block associated with the relative wear counter storing the relatively low value to the memory block associated with the relative wear counter storing the relatively high value.

* * * * *